US 6,624,994 B1

(12) United States Patent
Schmoock et al.

(10) Patent No.: US 6,624,994 B1
(45) Date of Patent: Sep. 23, 2003

(54) APPARATUS AND METHOD FOR OVER-CURRENT PROTECTION OF AN ANALOG SWITCH

(75) Inventors: James Charles Schmoock, Granite Bay, CA (US); Jeffrey P. Kotowski, Nevada City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 173 days.

(21) Appl. No.: 10/010,082

(22) Filed: Nov. 9, 2001

(51) Int. Cl.[7] .......................... H02H 9/02; H02H 3/093
(52) U.S. Cl. ................... 361/93.1; 361/93.9; 361/98; 323/908
(58) Field of Search ........................ 361/88, 78, 79, 361/86, 87, 91.1, 93.1, 93.9, 98, 101; 323/908; 363/49

(56) References Cited

U.S. PATENT DOCUMENTS 4,860,154 A * 8/1989 Fazlollahi ................ 361/101
5,428,287 A * 6/1995 Agiman ................. 361/101 X
5,485,341 A * 1/1996 Okado et al. ............... 361/98

OTHER PUBLICATIONS

"Single Port USB Power Switch And Over–Current Protection", *National Semiconductor Corporation*, LM3525, Jan. 2000, pp. 1–10.

* cited by examiner

Primary Examiner—Jessica Han
(74) Attorney, Agent, or Firm—Merchant & Gould P.C.; John W. Branch

(57) ABSTRACT

A multiple over current protection circuit for regulating current through an analog switch coupled between a power supply and a load. In a first circuit, a comparator monitors a voltage drop across the analog switch. When the voltage drop exceeds a reference voltage, the comparator momentarily activates a first transistor and causes an amplifier to enter a current limiting mode. The activated first transistor causes the analog switch to momentarily turn off. In a second circuit, the comparator activates a second transistor. During the current limiting mode of the amplifier, a constant voltage is maintained at the source of the second transistor and the load side of the analog switch. A current source draws a current through the second transistor. Also, the current flowing through the analog switch tracks the current flowing through the second transistor.

15 Claims, 3 Drawing Sheets

APPARATUS AND METHOD FOR OVER-CURRENT PROTECTION OF AN ANALOG SWITCH

FIELD OF THE INVENTION

The present invention relates generally to an over-current protection circuit. More particularly, the present invention relates to controlling the amount of current that flows through an analog switch.

BACKGROUND OF THE INVENTION

Computing devices are used with peripheral devices such as keyboards, mice and printers. A Universal Serial Bus (USB) port is often employed to connect one or more peripheral devices to a computing device. The USB port can be employed for both communicating with a peripheral device and also providing the electrical power that is used to operate the peripheral device. However, when a short to ground occurs, the maximum amount of electrical power provided to the peripheral device must be controlled to prevent damage to the USB port and/or the computing device.

An analog switch is often employed to control the amount of current (power) provided to a peripheral device through a USB port. Typically, an over-current protection scheme for the analog switch is used to prevent damage to the USB port caused by excess current flowing through the port to the peripheral device. Also, the over-current protection scheme can prevent the computing device's power supply for the USB port from getting loaded down and affecting the proper operation of other components in the computing device. For example, if a paper clip is inadvertently inserted into a USB port, this action could inadvertently cause the computing device's power supply to short to ground, which may result in significant damage to the power supply and prevent the computing device's other components from operating properly. Without an over-current protection scheme limiting the amount of current flowing through the analog switch, a fire could result from a hard electrical short to ground.

To provide some level of protection for a computing device, an over-current protection scheme should immediately sense when a hard short to ground occurs, i.e., a relatively large current is drawn through the analog switch. As soon as an excessive current is detected, the scheme causes the analog switch to immediately turn off. In the past, the over-current protection scheme typically entailed placing a chemical fuse in series with the analog switch. The chemical fuse would open the connection whenever excess current was drawn through the analog switch. After a period of time, the chemical fuse would regenerate and close the connection so that current could again flow through the analog switch.

Chemical fuses have several disadvantages. When multiple short circuits occur over a relatively short period of time, the resistance of the fuse can increase. When this condition occurs, a computing device's power supply may not be able to provide the required voltage to a peripheral device connected to a USB port. Additionally, the performance of a chemical fuse (ability to open a connection and regenerate) can degrade with repeated use over time. Also, the addition of a chemical fuse can increase costs and occupy valuable space in an integrated circuit package.

SUMMARY OF THE INVENTION

In accordance with the invention, a multiple over current protection scheme is provided for controlling current through an analog switch that is coupled between a power supply and a load. The scheme includes a first circuit that comprises a comparator for monitoring a voltage drop across the analog switch. The comparator outputs a signal that momentarily activates a first transistor when the voltage drop exceeds a reference voltage. The activated first transistor causes the analog switch to turn off. The scheme also includes a second circuit that comprises a second transistor, an amplifier, and a current source. The amplifier enters a current limiting mode and the second transistor is activated when the voltage drop across the analog switch causes the comparator to output the signal. The amplifier in the current limiting mode maintains a constant voltage at the source of the second transistor and the load side of the analog switch. Also, the current source draws a current through the second transistor. Moreover, the maximum amount of current flowing through the analog switch is controlled by a tracking of the current flowing through the second transistor.

In accordance with another aspect, the invention is directed to including with the first circuit a single-shot pulse generator coupled between the comparator and the first transistor. The comparator triggers the single-shot pulse generator to momentarily activate the first transistor when the voltage drop across the analog switch exceeds the reference voltage.

In accordance with yet another embodiment, the invention is directed to providing a third transistor to operate as the analog switch. The analog switch can be a selected one of MOS, JFET, Bipolar and GaAs semiconductor devices. The drain of the first transistor is coupled to the gate of the third transistor. The third transistor is momentarily turned off when the first transistor is activated.

In accordance with still another embodiment, the invention is directed to providing a third transistor that is physically larger than the second transistor by a factor. The amount of current flowing through the third transistor is limited to the product of the current flowing through the second transistor and a ratio of the physical size differences between the third transistor and the second transistor.

In accordance with another embodiment, the invention is directed to coupling the source of the second transistor and the source of the third transistor to the inputs of the amplifier. Also, the output of the amplifier can be coupled to the gate of the second transistor and the gate of the third transistor.

In accordance with yet another embodiment, the invention is directed to a latch and a switch coupled between the gate of the second transistor and the output of the comparator, which is included with the second circuit. The latch triggers the switch when the comparator is activated causing the amplifier to enter the current limiting mode. The latch can be a selected one of SR, JK and D flip flops. Additionally, the analog switch can provide electrical power to a peripheral device coupled to a USB port. Also, the reference voltage can be approximately 100 milliVolts, the current source outputs approximately 1 milliAmp and the factor approximately 1000.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION OF THE PREFERRED EMBODIMENT

Figure 1:
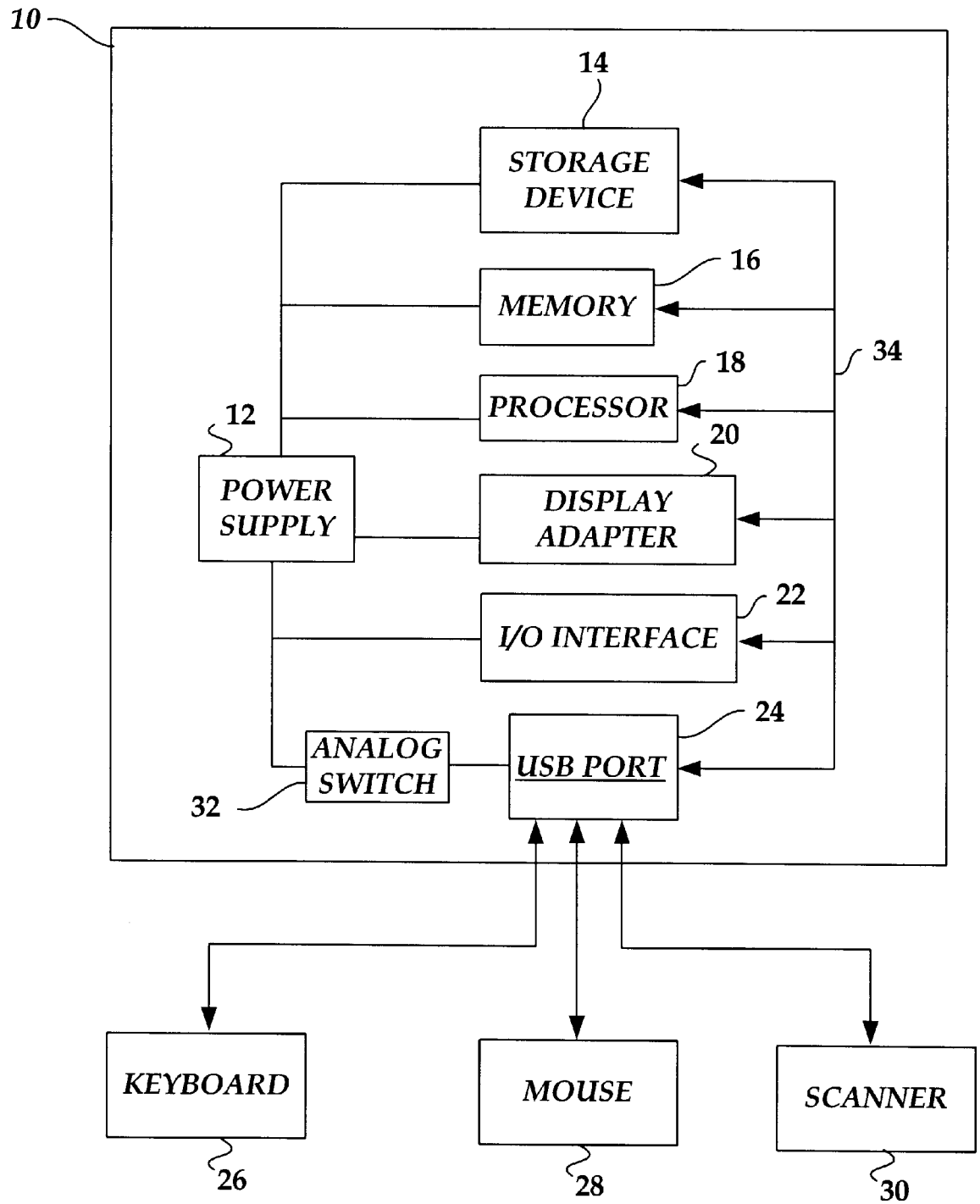
FIG. 1 is a diagram showing an integrated system for providing electrical power to a peripheral device through a USB port.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on".

The inventive multiple over-current protection circuit provides for controlling the current flowing through an analog switch that is coupled between a power supply and a load. In a first sub-circuit, a comparator monitors a voltage drop across the analog switch. When the voltage drop exceeds a reference voltage, the comparator immediately activates a first transistor and also causes an amplifier to enter a current limiting mode. The activated first transistor causes the analog switch to turn off momentarily and open the connection between the power supply and the load.

In a second sub-circuit, the comparator activates a second transistor when the reference voltage is exceeded. Also, while the amplifier is operating in the current limiting mode, a constant voltage is maintained at the source of the second transistor and the load side of the analog switch. A current source draws a current through the second transistor. After the momentary opening caused by the operation of the first sub-circuit, the analog switch turns back on and closes the connection so that the amount of current flowing through the switch will track the current flowing through the second sub-circuit's second transistor.

The second sub-circuit outputs a high signal to maintain activation of the analog switch while the amount of current flowing through the analog switch is less than the maximum current set by the second sub-circuit. A reference voltage for the first sub-circuit is generally set to a value, which causes the comparator to activate at an output current that is slightly above the maximum current limited by the second sub-circuit. Because of the way that the second sub-circuit operates, it can also protect the analog switch against "soft" shorts (lower current) that would not be sufficient to trigger the first sub-circuit.

One advantage of the combined operation of these two sub-circuits is to provide over-current protection that can operate instantaneously to protect the analog switch against damage caused by a sudden hard short to ground; and also provide over-current protection that can control the maximum amount of current flowing through the analog switch for an extended period of time. For several reasons, the speed at which the second sub-circuit can react to a short is initially slower than that of the first sub-circuit. However, once the second sub-circuit is activated, it can limit excessive current flow through the analog switch.

FIG. 1 shows an exemplary computing device 10 that provides power to peripheral devices through an analog switch 32 that is coupled to USB port 24. It is understood that in different embodiments computing device 10 could be a personal digital assistant (PDA), personal computer, notebook computer, server computer, video game console, cellular telephone, media player, network appliance and the like. Computing device 10 includes power supply 12, which provides power to at least some of the components in the computing device. The components include storage device 14, memory 16, processor 18, display adapter 20, I/O interface 22 and USB port 24. Bus 34 enables the components of computing device to communicate with each other as necessary to operate the computing device. Also, power supply 12 is coupled to analog switch 32 to provide power to external peripheral devices coupled to computing device 10. The peripheral devices include keyboard 26, mouse 28 and scanner 30. This arrangement enables power supply 12 to provide power to the peripherals devices so that they do not require a separate power supply to operate with computing device 10.

Figure 2:
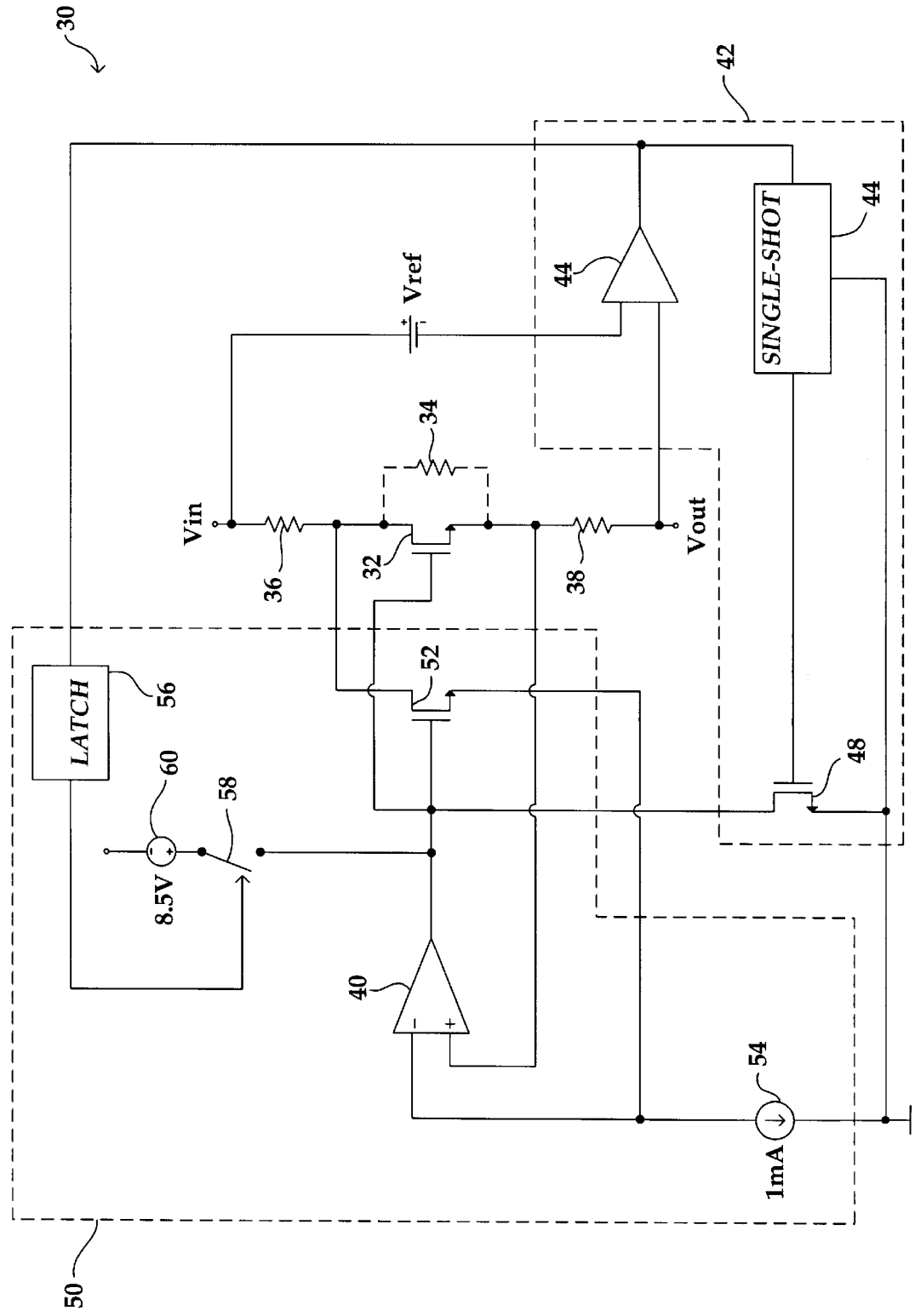
FIG. 2 is a schematic diagram showing a multiple over-current protection circular or an analog switch.

As shown in FIG. 2, over-current protection circuit 30 includes an analog switch that is represented by switch transistor 32 and which is shown as an N-channel MOSFET transistor. Switch transistor 32 operates as an analog switch to control the switching of power provided to a load, e.g., a power supply coupled to VIN and a peripheral device (load) coupled to VOUT. Switch transistor 32 could be embodied by one or more semiconductor devices such as a Bipolar, JFET, GaAs or other transistor that are arranged to operate as an analog switch. Resistor 34, shown in phantom lines, is coupled between the drain and the source of switch transistor 32 and represents the parasitic series resistance of switch transistor 32. Resistor 36 is coupled between the drain of switch transistor 32 and input voltage $V_{IN}$. Resistor 38 is coupled between the source of switch transistor 32 and output voltage $V_{OUT}$. Resistors 36 and 38 represent the parasitic resistances in pins, bond wires, and metallization that are used to place switch transistor 32 in an integrated circuit package. When switch transistor 32 operates as a closed switch (conducts current across its drain and source), output voltage $V_{OUT}$ is approximately equal to input voltage $V_{IN}$.

In normal operation and when over-current protection circuit 30 starts up, operational amplifier 40 outputs a positive voltage to the gate of switch transistor 32, which causes switch transistor 32 to turn on (conduct current). Switch transistor 32 is kept active by maintaining the high amplifier output. When switch transistor 32 is conducting (closed analog switch), current flows from $V_{IN}$ to $V_{OUT}$. Amplifier 40 can provide a low output to turn off switch transistor 32 (open analog switch).

The invention utilizes at least two sub-circuits that work in combination to provide an over-current protection scheme that protects switch transistor 32 for both instantaneous hard shorts to ground and soft shorts. First sub-circuit 42 comprises voltage comparator 44, reference voltage $V_{REF}$, single-shot pulse generator 46, and N-channel MOSFET transistor 48. Reference voltage $V_{REF}$ has a positive terminal coupled to input voltage $V_{IN}$ and a negative terminal coupled to an input of comparator 44. The other input of comparator 44 is coupled to output voltage $V_{OUT}$. The output of comparator 44 is coupled to an input of single-shot pulse generator 46. An output of single-shot pulse generator 46 is coupled to the gate of transistor 48. The drain of transistor 48 is coupled to the gate of switch transistor 32. The source of transistor 48 is coupled to ground.

Current flowing through switch transistor 32 causes a voltage drop across parasitic resistances 34, 36 and 38; and comparator 44 senses this voltage drop. Comparator 44 compares the voltage drop across switch transistor 32 to reference voltage $V_{REF}$. In one embodiment, parasitic resistance 34 is approximately 100 milliohms and reference voltage $V_{REF}$ is set to 100 milliVolts. Thus, under normal operating conditions, the total voltage drop across the switch transistor would be less than 100 mV.

In one embodiment, under normal operating conditions, the current flowing through switch transistor 32 is approximately 500 mA. However, whenever $V_{OUT}$ is shorted to ground, the current flowing through switch transistor 32 will rapidly increase. As this increasing current approaches 1 Ampere, a 100 milliVolt drop will appear across switch transistor 32. When the current flowing through switch transistor 32 exceeds a predetermined value, comparator 44 will trip. In this case, comparator 44 trips because one of the inputs ($V_{OUT}$) to the comparator becomes approximately 100 mV.

When tripped, comparator 44 activates single-shot pulse generator 46, which momentarily turns on transistor 48. Transistor 48 momentarily conducts and pulls the gate of switch transistor 32 to ground. Switch transistor 32 is momentarily turned off (open analog switch) and opens the connection between $V_{IN}$ and $V_{OUT}$. It is understood that switch transistor 32 could be embodied by one or more semiconductor devices such as a Bipolar, JFET, GaAs, and the like, that are arranged to operate as an analog switch.

When the short between $V_{OUT}$ and ground that triggered the operation of first sub-circuit 42 continues for more than a relatively brief period of time, second sub-circuit 50 is also enabled. Second sub-circuit 50 comprises operational amplifier 40, N-channel MOSFET sense transistor 52, current source 54, latch 56, and momentary switch 58. It is understood that latch 56 could be embodied by any one of SR, JK, D, and the like, flip-flops. It is also understood that current source 54 may be embodied as a perfect or non-perfect current source. When a non-perfect current source is employed, a soft clamp such as a diode-resistor circuit may be used to control its operation. Operationally, the soft clamp helps hold up the voltage drop across the non-perfect current source when a short to ground occurs at $V_{OUT}$.

The drain of sense transistor 52 is coupled to the drain of switch transistor 32. The gate of sense transistor 52 is coupled to the gate of switch transistor 32. The negative input of operational amplifier 40 is coupled to the source of sense transistor 52 and the input terminal of current source 54. The positive input of operational amplifier 40 is coupled to the source of switch transistor 32. The output terminal of current source 54 is coupled to ground. One terminal of switch 58 is coupled to voltage source 60 (shown as 8.5 Volts). The other terminal of switch 58 is coupled to the gate of switch transistor 32. The set terminal for latch 56 is coupled to the output of comparator 44. The output terminal of latch 56 is coupled to switch 58. It is appreciated that switch 58 could be embodied by one or more semiconductor transistor devices such as a Bipolar, JFET, MOS, GaAs, and the like, that are arranged to operate as a switch.

As described above, comparator 44 will trip when the current through switch transistor 32 approaches 1 ampere (typically caused by a hard short between $V_{OUT}$ and ground). When comparator 44 trips, it also sets latch 56. The setting of latch 56 causes the activation (opening) of switch 58. Also, operational amplifier 40 begins operating in a current limiting mode when switch 58 opens. In this mode, operational amplifier 40 stops outputting a high signal to activate switch transistor 32. Instead, operational amplifier 40 begins outputting a signal that is controlled by its feedback loop.

In the current limiting mode, operational amplifier 40 outputs a signal that tries to minimize the difference between the voltages presented at its inputs by the feedback loop. As operational amplifier 40 adjusts its output signal in relation to the differential signal at its inputs, it is also setting the gate voltage for switch transistor 32 at a value that will cause the source voltages to be relatively equal for both sense transistor 52 and the switch transistor. Current flowing through switch transistor 32 is regulated/controlled, in part, because the sources of the switch transistor and the sense transistor are both coupled to the inputs of amplifier 40. Also, since the gates of transistors 32 and 52 are coupled together, the gate-to-source voltages of these transistors are approximately equal.

Additionally, switch transistor 32 is selected to be approximately 1000 times physically larger than sense transistor 52. The current flowing through switch transistor 32 and sense transistor 52 will track each other in accordance with the ratio of their relative sizes. In one embodiment, current source 54 is selected to draw a 1 milliAmp current through sense transistor 52. In this case, when output voltage $V_{OUT}$ is shorted to ground, the feedback loop of amplifier 40 will regulate the current flowing through switch transistor 32 to 1 ampere, i.e., 1000 times the current flowing through sense transistor 52. In other words, a 1 mA current running through sense transistor 52 will regulate the amount of current flowing through switch transistor 32 to 1 ampere. This current limiting scheme enables current to continue to flow through switch transistor 32 when a short is present, but only up to a specified value, e.g. 1 ampere. By limiting the amount of current flowing through switch transistor 32 to a predetermined value, the invention can prevent burn out and voltage supply overloading when both hard and soft shorts occur.

Excessive current flow is sensed through switch transistor 32 by monitoring the voltage presented at the inputs to comparator 44. When output voltage $V_{OUT}$ is no longer shorted to ground or the total load on is low enough in resistance to cause the current through switch transistor 32 to drop below the normal rated current, e.g., 500 mA, the voltage drop at $V_{OUT}$ will become smaller than the difference in voltage between $V_{IN}$ and $V_{REF}$. When this occurs, comparator 44 will turn off and reset latch 56 which will cause the feedback loop for amplifier 40 to shut down. Next, the amplifier will stop its current-limiting mode operation and return to a normal mode of operation, i.e., the output of amplifier 40 returns to a constant high state, closes switch 58 and activates switch transistor 32 (closed switch).

In this way, when a short causes too much current to surge through switch transistor 32, it is initially turned off and subsequently turned on to provide a regulated flow of current until the short is removed. The invention prevents damage to components by regulating the maximum amount of current that can flow through switch transistor 32 without causing any damage.

Figure 3:
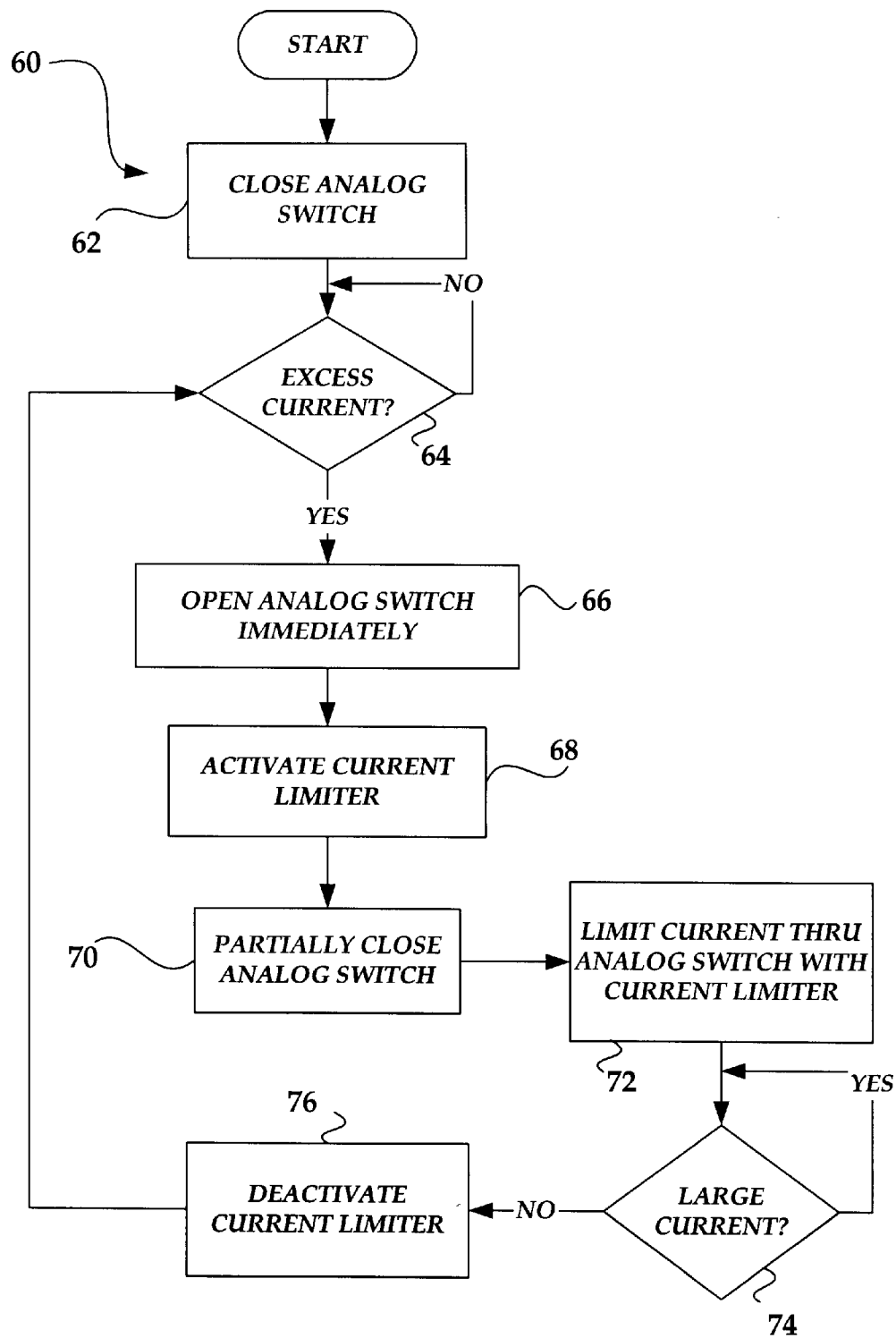
FIG. 3 is a flow chart showing the actions for providing a multiple over-current protection scheme in accordance with the present invention.

FIG. 3 illustrates an overview of flow chart 60 to provide a multiple over current protection scheme. Moving from a start block, the process advances to block 62 where an analog switch is closed to provide current from a power source to a load. The process flows to decision block 64 where a determination is made as to whether excess current flowing through the analog switch is detected. Typically, the excess current flow is caused by a short to ground on the load side of the analog switch. If the determination is false, the process loops until true.

When the determination at decision block 64 is affirmative, the process advances to block 66 where the analog switch is immediately opened. Next, at block 68, a current limiter is activated. Moving to block 70, the analog switch is partially closed so that current can now flow through the switch. At block 72, the current flowing through the analog switch is limited to a maximum value determined by the current limiter. Advancing to decision block 74, a determination is made as to whether the current flowing through the analog switch is at the maximum value, i.e, is the short to ground still present. If true, the process loops until false. When the determination at decision block 74 is negative, the process moves to block 76 where the current limiter is deactivated. Next, the process returns to decision block 64 and performs substantially the actions discussed above.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A multiple over current protection circuit for controlling current through an analog switch coupled between a power supply and a load, comprising:

(a) a first circuit including a comparator for monitoring a voltage drop across the analog switch, the comparator outputting a signal that momentarily activates a first transistor when the voltage drop exceeds a reference voltage, wherein the activated first transistor causes the analog switch to turn off; and (b) a second circuit comprising a second transistor, an amplifier, and a current source, the amplifier entering a current limiting mode and the second transistor being activated when the voltage drop across the analog switch causes the comparator to output the signal, wherein the amplifier in the current limiting mode maintains a constant voltage at the source of the second transistor and the load side of the analog switch, and the current source draws a current through the second transistor, wherein the maximum amount of current flowing through the analog switch is controlled by a tracking of the current flowing through the second transistor.

2. The circuit of claim 1, wherein the first circuit further comprises a single-shot pulse generator coupled between the comparator and the first transistor, the comparator triggering the single-shot pulse generator to momentarily activate the first transistor when the voltage drop across the analog switch exceeds the reference voltage.

3. The circuit of claim 1, wherein the analog switch is a third transistor, that is a selected one of MOS, JFET, Bipolar and GaAs semiconductor devices.

4. The circuit of claim 3, wherein the drain of the first transistor is coupled to the gate of the third transistor, the third transistor being momentarily turned off when the first transistor is activated.

5. The circuit of claim 4, wherein the third transistor is physically larger than the second transistor by a factor, the amount of current flowing through the third transistor being limited to the product of the current flowing through the second transistor and a ratio of the physical size differences between the third transistor and the second transistor.

6. The circuit of claim 5, wherein the reference voltage is approximately 100 milliVolts, the current source outputs approximately 1 milliAmp and the factor is approximately 1000.

7. The circuit of claim 3, wherein the output of the amplifier is coupled to the gate of the second transistor and the gate of the third transistor.

8. The circuit of claim 3, wherein the source of the second transistor and the source of the third transistor are coupled to the inputs of the amplifier.

9. The circuit of claim 1, wherein the second circuit further comprises a latch and a switch coupled between the gate of the second transistor and the output of the comparator, the latch triggering the switch when the comparator is activated causing the amplifier to enter the short-circuit current limiting mode.

10. The circuit of claim 9, wherein the latch is a selected one of SR, JK and D flip flops.

11. The circuit of claim 1, wherein the analog switch provides electrical power to a peripheral device coupled to a USB port.

12. A multiple over current protection circuit for controlling current through an analog switch coupled between a power supply and a load, comprising:

(a) means for controlling an instantaneous increase in current caused by a short at the load by monitoring a voltage drop across the analog switch with a comparator, the comparator outputting a signal that momentarily activates a first transistor when the voltage drop exceeds a reference voltage, wherein the activated first transistor causes the analog switch to turn off; and (b) means for controlling the increase in current caused by the short over a period of time with a second transistor, an amplifier, and a current source, the amplifier entering a current limiting mode and the second transistor being activated when the voltage drop across the analog switch causes the comparator to output the signal, wherein the amplifier in the current limiting mode maintains a constant voltage at the source of the second transistor and the load side of the analog switch, and the current source draws a current through the second transistor, wherein the maximum amount of current flowing through the analog switch is controlled by a tracking of the current flowing through the second transistor.

13. A method for providing multiple over current protection for controlling current through an analog switch coupled between a power supply and a load, comprising:

(a) controlling an instantaneous increase in current caused by a short at the load by monitoring a controlling a short by monitoring a voltage drop across the analog switch with a comparator, the comparator outputting a signal that momentarily activates a first transistor when the voltage drop exceeds a reference voltage, wherein the activated first transistor causes the analog switch to turn off; and (b) controlling the short over a period of time with a second transistor, an amplifier, and a current source, the amplifier entering a current limiting mode and the second transistor being activated when the voltage drop across the analog switch causes the comparator to output the signal, wherein the amplifier in the current limiting mode maintains a constant voltage at the source of the second transistor and the load side of the analog switch, and the current source draws a current through the second transistor, wherein the maximum amount of current flowing through the analog switch is controlled by a tracking of the current flowing through the second transistor.

14. The method of claim 13, further comprising employing the comparator to trigger a single-shot pulse generator to momentarily activate the first transistor when the voltage drop across the analog switch exceeds the reference voltage.

15. The method of claim 14, further comprising limiting the amount of current flowing through the analog switch based on the product of the current flowing through the second transistor and a ratio of the physical size differences between the analog switch and the second transistor, wherein the analog switch is physically larger than the second transistor by a factor.

* * * * *

UNITED STATES PATENT AND TRADEMARK OFFICE
CERTIFICATE OF CORRECTION

PATENT NO. : 6,624,994 B1
DATED : September 23, 2003
INVENTOR(S) : James Schmoock et al.

It is certified that error appears in the above-identified patent and that said Letters Patent is hereby corrected as shown below:

Column 2,
Line 62, delete "flip flops" and insert -- flip-flops --.

Column 3,
Line 14, after "port" delete "," and insert -- ; --.
Line 16, delete "circular or" and insert -- circuit for --.

Column 4,
Line 47, delete "VIN" and insert -- $V_{IN}$ --.
Line 48, delete "VOUT" and insert -- $V_{OUT}$ --.

Column 7,
Line 49, delete "i.e," and insert -- i.e., --.

Column 8,
Line 58, delete "flip flops" and insert -- flip-flops --.

Signed and Sealed this

Twenty-eighth Day of December, 2004

JON W. DUDAS
*Director of the United States Patent and Trademark Office*